United States Patent [19]

Yundt

[11] Patent Number: 4,804,903
[45] Date of Patent: Feb. 14, 1989

[54] SYSTEM FOR MEASURING LOAD CURRENT IN AN ELECTRONICALLY CONTROLLED SWITCH

[75] Inventor: George B. Yundt, Cambridge, Mass.

[73] Assignee: The Charles Stark Draper Laboratory, Inc., Cambridge, Mass.

[21] Appl. No.: 548,404

[22] Filed: Nov. 3, 1983

[51] Int. Cl.$^4$ .......................... G01R 1/02; G01R 1/30
[52] U.S. Cl. ................................... 324/130; 324/123 R
[58] Field of Search .................... 324/130, 154 R, 74, 324/76 R, 123 R, 102, 126, 158 MG

[56] References Cited

U.S. PATENT DOCUMENTS

| | | | |
|---|---|---|---|
| 412,354 | 10/1889 | Wood | 324/154 R |
| 3,070,786 | 12/1962 | MacIntyre | 324/130 |
| 3,532,980 | 10/1970 | Tucker | 324/130 |
| 3,667,041 | 5/1972 | Senour | 324/130 |
| 3,667,056 | 5/1972 | Allington et al. | 328/114 |
| 4,291,268 | 9/1981 | Okuyama | 324/154 R |

OTHER PUBLICATIONS

Donald E. Fulton, "Resistive Current Sensing for AC Motor Control", Apr. 1983, pp. 248-253.

Primary Examiner—Ernest F. Karlsen
Attorney, Agent, or Firm—Fish & Richardson

[57] ABSTRACT

A new sensor means for accurately measuring the current flowing in an electronically controlled switch is presented. An ac coupled current sensor is arranged in circuit with the electronically controlled power switch. The output of the sensor channel is zeroed (or restored to another fixed independent level) whenever the power switch is in the OFF condition. Using the natural modulation of the power switch itself to coordinate the reconciling of the sensor output level with the OFF state of the power switch helps restore to the dc level lost through ac coupling. This coordination of the sensor with the switch itself reduces dc offset and drift and allows ac coupling, which removes dc common mode and increases primary current sensor flexibility, all without adding complexity. A plurality of such sensors can be combined to measure indirectly the load current from a plurality of switches according to Kirchoff's Current Law.

19 Claims, 1 Drawing Sheet

SYSTEM FOR MEASURING LOAD CURRENT IN AN ELECTRONICALLY CONTROLLED SWITCH

BACKGROUND OF THE INVENTION

The invention relates generally to the field of current measurement in power switches, and particularly to load current measurement in switch mode power amplifiers and power supplies.

The subject of the invention is measuring the current flowing through a switch from a power source to a load. Knowledge of the instantaneous amplitude of electrical current flowing to a load is necessary for feedback control systems in switching mode current sources such as the type used to drive three-phase ac motors, or for over-current fault detection in voltage output systems. A very common technique, used particularly in ac motor control, employs a Hall effect sensor on the output line. The Hall probe is relatively expensive, requires complex electronics and exhibits a moderate dc drift term in the output. Another prior art technique uses a sense resistor in series with the output line to the load and a differential amplifier to sense the voltage developed across the resistor. Being in the output line, however, the sense resistor is subjected to a large common mode term from the output voltage. In switching mode systems the switched output voltage means that the differential amplifier needs a very high common mode rejection ratio from dc to high frequencies. In practice this requirement is costly to achieve.

SUMMARY OF THE INVENTION

The general purpose of the invention is to provide a simpler, more accurate way to measure the instantaneous current flowing in a switching output stage of a switching power supply or more generally of a switching amplifier. The main objectives are to avoid the common mode noise, offset, and drift problems associated with standard current sensors applied to electronically controlled power switches.

These and other objects of the invention are achieved by arranging an ac coupled current sensor in circuit with an electronically controlled power switch and zeroing (or restoring to another fixed independent level) the output of the sensor whenever the power switch is in the OFF condition. Using the natural modulation of the switch itself to coordinate the reconciling of the sensor output level with the OFF state of the switch enables the dc level lost through ac coupling to be restored. This coordination of the sensor function with the power switch itself avoids the dc common mode and reduces offset and offset drift without adding complexity.

In a multi-polar current switch, the output of each current sensor (one per leg) is zeroed when the corresponding leg of the current switch is OFF. In other words, each sensor output is zeroed synchronously with the natural modulation of the switching sequence of the corresponding power switch. The outputs of the current sensors are then fed to a summing device. The resulting output of the summation device accurately represents the current flowing out of the multi-polar switch because the summation can be set up to follow Kirchoff's Current Law (KCL) for the output node.

In one embodiment, the current sensor comprises a resistor inserted between the power switch and a voltage source. A differential amplifier ac coupled to the ends of the resistor produces a signal that is coupled to the sensor's output via an output capacitor. The output side of the output capacitor is connected to ground via a signal switch that is closed when the power switch is open. Alternatively, the sensor can be implemented with a current transformer substituted for the resistor.

DESCRIPTION OF THE PREFERRED EMBODIMENT

Figure 1:
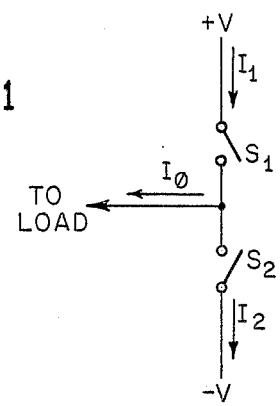
FIG. 1 is a schematic representation of current flowing through a bipolar power switch.

FIG. 1 shows an example switching amplifier output stage commonly referred to as a buck switching stage. This stage consists of a pair of series-connected semiconductor switches $S_1$ and $S_2$ inserted between the positive and negative terminals of a dc power source as shown. The negative or positive voltage terminals or some other potential can provide the return path for the load current. The load is connected to the junction of switch pairs $S_1$ and $S_2$. The switches may be open at the same time, but they are never simultaneously closed. Accordingly, when just switch $S_1$ is closed, the load is connected only to the positive voltage terminal and when switch $S_2$ is closed, the load is connected only to the negative voltage terminal.

The current flowing through the junction in the output stage is constrained by KCL. Thus, the relationship between the load current $I_o$ and the switch currents is $$I_o = I_1 - I_2$$

where $I_1$ is the current flowing from the positive voltage terminal toward the junction through switch $S_1$ and $I_2$ is the current flowing away from the junction to the negative terminal through switch $S_2$. This relationship obviates direct sensing of the current flowing into the load from the switching stage ($I_o$) as it can be represented by the difference between $I1$ and $I2$.

Figure 2:
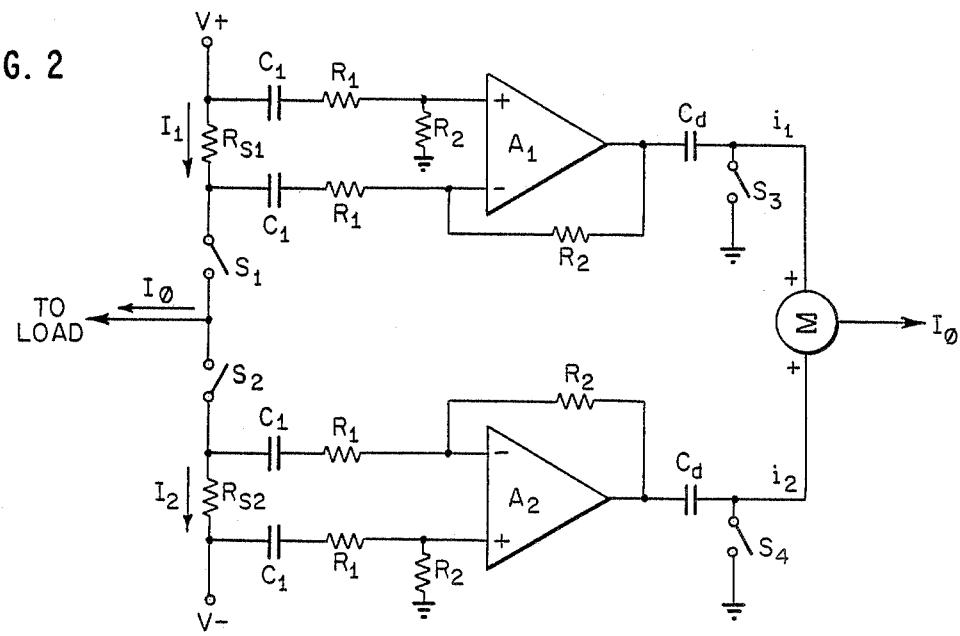
FIG. 2 is a schematic diagram of a resistive current sensing system for the power switch of FIG. 1 according to the invention.

FIG. 2 shows a representative sensing circuit according to the invention for generating a value representing $I_o$ as the difference between $I_1$ and $I_2$ that makes good use of KCL as well as the natural modulation function exhibited by switches $S_1$ and $S_2$ to avoid large common mode signals and eliminate dc offset and offset drift. Sense resistors are employed in each leg of the modified bipolar switch of FIG. 1. Sense resistor $R_{S1}$ is inserted in series between the positive voltage source and current switch $S_1$. The voltage across sense resistor $R_{S1}$ is ac coupled to a differential amplifier $A_1$ as shown. The output of the differential amplifier $A_1$ is coupled via series capacitor $C_d$ and parallel ground switch $S_3$ to a positive input of a summation circuit as shown. The sensor circuit for the other leg is implemented in an analogous way. Thus, sense resistor $R_{S2}$ is connected in series between the negative voltage source and switch $S_2$. The voltage across resistor $R_{S2}$ is ac coupled as shown to an identical differential amplifier $A_2$ whose inputs are reversed and whose output is coupled via capacitor $C_d$ and ground switch $S_4$ to another positive input of the summation circuit. Note that after ac coupling the voltages across $R_{S1}$ and $R_{S2}$, the differential amplifiers should only have small common mode inputs. The output of the summation circuit is a representation of the current $I_o$ flowing out of the current switch or to the load.

The state of switches $S_1$ and $S_2$ is determined by an output controller (not shown) with the restriction that one and only one of these switches can be ON at any given time. The voltage across $R_{S1}$ or $R_{S2}$ must go to zero whenever switch $S_1$ or $S_2$, respectively, is OFF. The outputs of the two sensor paths can thus be synchronously demodulated and then added to obtain the low dc offset and drift output voltage proportional to $I_o$. The synchronous demodulation is accomplished by closing ground switch $S_3$ only when switch $S_1$ is open and closing switch $S_4$ only when $S_2$ is open. Because the current $I_1$ is known to be zero when $S_1$ is open, closing switch $S_3$ when $S_1$ is open resets the $I_1$ output to zero while charging capacitor $C_3$ to the proper value for when $S_1$ next closes. This demodulation function in effect restores the dc level of the sensed current in a given channel.

Figure 3:
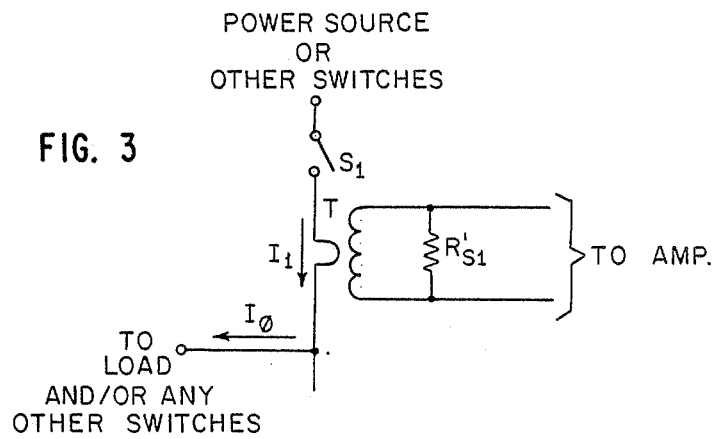
FIG. 3 is a schematic diagram of an alternate sensor embodiment employing a current transformer.

Alternatively, current transformers can be substituted for the sense resistors $R_{S1}$ and $R_{S2}$ of FIG. 2. As shown in FIG. 3, the primary winding of a current transformer T is connected between the power switch $S_1$ and the load junction. The secondary is shunted by resistor $R_{S1}$, opposite ends of which are coupled to differential amplifier $A_1$ as in FIG. 2. The transformer embodiment of FIG. 3 further isolates the sensor from the switch.

Use of the disclosed current sensing scheme provides many advantages over prior art direct sensing systems. The resulting low dc offset and drift that is characteristic of the demodulated signal is comparable to a chopper stabilized amplifier since the gain is performed at ac and then demodulated back to the proper frequency band. The system is not just a chopper stabilized amplifier because the chopping is introduced by the power switch controller and not by the sensor system. The system will work with any power switch as long as the duty cycle is never allowed to go to 0% or 100%.

This invention is not restricted in application to bipolar current switch configurations. The current flowing in any electronically controlled power switch can be measured with low offset by using the natural chopping action of the switch to coordinate re-zeroing of the offset of the corresponding sensor during the power switch's OFF period. This feature exists whether there is one or a plurality of switches. The net output or load current from a combination of power switches connected to a load through a common junction can be determined by using KCL to form appropriate sums of individual currents as in the particular example of FIG. 2.

Many variations and modifications of the foregoing circuitry can be accomplished without departing from the spirit and scope of the invention. For example, while current transformers and sense resistors are shown, other forms of current sensors are not necessarily precluded. The specific type of differential amplifier and ac coupling circuitry for implementing any sensor channel according to the invention may, of course, take on different configurations. Accordingly, the foregoing description of a specific embodiment is intended to be illustrative and not restrictive as to the scope of the invention which is indicated in the appended claims and equivalents thereto.

What is claimed is:

1. A system for measuring current amplitude to a load, comprising
   a current loop delivering direct current to the load,
   an electronically controlled series switch in said loop modulated with a duty cycle substantially less than 100%, capable of an ON state and an OFF state wherein no current flows in said loop,
   sense resistor means in series with said switch in said loop for developing a voltage proportional to current through said switch,
   an amplifier,
   means for ac coupling the voltage developed across said sense resistor means with no dc component to the input of said amplifier, and
   switch means controlled by the natural modulation of said electronically controlled switch for coupling the output of said amplifier to a fixed voltage level corresponding to zero current synchronously with the OFF condition of said electronically controlled switch.

2. The system of claim 1, wherein said amplifier is a differential amplifier, the ends of said resistor means being ac coupled to respective opposite inputs of said amplifier.

3. The system of claim 1, wherein said fixed voltage level is ground.

4. The system of claim 1, further comprising an output capacitor connected between the output of said amplifier and said switch means.

5. A system for measuring current amplitude to a load, comprising
   a current loop for delivering direct current to the load,
   an electronically controlled series current switch in said loop modulated with a duty cycle substantially less than 100%, capable of an ON state and an OFF state wherein no current flows in said loop,
   an amplifier,
   sensor means in series with said current switch in said loop for developing an input signal to said amplifier, with no dc component from said loop, indicative of the amplitude of current flowing through said current switch, and
   means synchronously responsive to the state of said current switch for artificially zeroing the output of said current amplifier whenever said current switch is OFF to intermittently restore the dc level.

6. The system of claim 5, wherein said sensor means includes a sense resistance element forming in series with said current switch in said loop, the voltage developed across said resistance element being ac coupled to the input of said amplifier.

7. The system of claim 6, wherein opposite ends of said resistance element are ac coupled to respective inputs of said amplifier.

8. The system of claim 5, wherein said sensor means includes a current transformer having a primary winding in series with said current switch in said loop and a secondary winding coupled to the input of said amplifier.

9. The system of claim 8, wherein said sensor means further includes a sense resistance element connected in parallel across opposite ends of said secondary winding, said secondary winding ends being further coupled to respective inputs of said amplifier.

10. The system of claim 5, further comprising a plurality of individual current measuring systems as set forth therein for a plurality of corresponding current loops each having a respective series current switch, wherein said loops are interconnected at a single node to form a network, said node having a single output to the load common to all of said loops and means for combining the outputs of said individual current measuring systems to produce an output indicative of the total level of current flowing through said output to the load.

11. The system of claim 10, wherein said combining means includes a summing circuit.

12. The system of claim 11, wherein said summing circuit algebraically combines the outputs of the individual current measuring systems so as to represent the total current flowing to the load according to KCL.

13. The system of claim 12, wherein each said individual current measuring system includes an output capacitor connected to each amplifier output, each zeroing means including switch means for grounding said output capacitor when the corresponding current switch is OFF.

14. The system of claim 5, 6 or 8 further comprising an output capacitor connected to said amplifier output, said zeroing means including switch means for grounding said output capacitor when the current switch is OFF.

15. A method of measuring current amplitude to a load, comprising delivering direct current to the load via a current loop with an electronically controlled series current switch modulated with a duty cycle substantially less than 100%, capable of an ON state and an OFF state wherein no current flows in said current loop, developing a signal across a conductive element in series with said current switch in said loop indicative of the amplitude of current flowing therethrough, ac coupling said signal with no dc component from said loop to an amplifier input, and in response to the natural modulation of said current switch, artificially zeroing the output of said amplifier whenever said current switch is OFF.

16. The method of claim 15 carried out simultaneously on a plurality of current loops each having a respective current switch, said current loops being interconnected in a network at a single node having a single output to the load common to all of said loops, and combining the amplifier outputs corresponding to said respective current switches to produce an output indicative of the total level of current flowing through said output from said node to the load.

17. The system of claim 16, wherein said combining step is carried out by algebraically combining said amplifiers outputs to represent the total current flowing to the load according to KCL.

18. A method of measuring the total current flowing through a network, comprising providing a plurality of interconnected current loops each having an electronically controlled current switch modulated with a duty cycle substantially less than 100% and capable of an ON state and an OFF state wherein substantially no current flows through the respective loop, said loops being connected at a single node with one output to the load common to all of said loops, producing a plurality of signals indicative of the amplitude of current flowing through corresponding ones of said current switches, in response to the natural modulation of the current switches, restoring respective ones of said signals to a fixed independent level corresponding to zero current whenever the corresponding current switch is in its OFF state, and combining the signal to produce a net output signal indicative of the total level of current flowing through said output from said node to the load.

19. The method of claim 18, wherein said combining step is carried out by algebraically combining said signals to represent the total current flowing to the load according to KCL.

* * * * *